United States Patent [19]

Spruyt

[11] Patent Number: 5,907,560
[45] Date of Patent: May 25, 1999

[54] METHOD FOR INTERLEAVING DATA FRAMES, FORWARD ERROR CORRECTING DEVICE AND MODULATOR INCLUDING SUCH A DEVICE

[75] Inventor: Paul Marie Pierre Spruyt, Heverlee, Belgium

[73] Assignee: Alcatel N.V., Netherlands

[21] Appl. No.: 08/700,756

[22] Filed: Aug. 15, 1996

[30] Foreign Application Priority Data

Aug. 21, 1995 [EP] European Pat. Off. ............ 95202244

[51] Int. Cl.$^6$ .................................................. H03M 13/22
[52] U.S. Cl. ........................................................ 371/2.1
[58] Field of Search ................................... 371/2.1, 39.1, 371/38.1, 37.4, 2.2, 37.02

[56] References Cited

U.S. PATENT DOCUMENTS

| | | | |
|---|---|---|---|
| 3,278,729 | 10/1966 | Chien | 371/39.1 |
| 3,657,699 | 4/1972 | Rocher et al. | 380/50 |
| 4,559,625 | 12/1985 | Berlekamp et al. | 371/2 |
| 4,907,233 | 3/1990 | Deutsch et al. | 371/37.4 |
| 4,916,702 | 4/1990 | Berlekamp | 371/39.1 |
| 5,063,533 | 11/1991 | Erhart et al. | 395/425 |
| 5,136,588 | 8/1992 | Ishijima | 371/2.1 |
| 5,592,492 | 1/1997 | Ben-Efraim et al. | 371/2.2 |
| 5,737,337 | 4/1998 | Voith et al. | 371/2.2 |
| 5,764,649 | 6/1998 | Tong | 371/2.1 |

FOREIGN PATENT DOCUMENTS

| | | |
|---|---|---|
| 0310089 | 4/1989 | European Pat. Off. . |
| 0435507 | 7/1991 | European Pat. Off. . |
| 0486729 | 5/1992 | European Pat. Off. . |
| 0578313 | 1/1994 | European Pat. Off. . |
| 0642228 | 3/1995 | European Pat. Off. . |
| 2592258 | 6/1987 | France . |
| 2703859 | 10/1994 | France . |
| 9518489 | 7/1995 | WIPO . |
| 9525386 | 9/1995 | WIPO . |

OTHER PUBLICATIONS

"Communications–Fusing Command, Control and Intelligence". conf. record (CAT 92CH3131–0) "A new block helical interleaver", pp. 799–804, ISBN 1992, NY, NY.

Transactions of the Institute of Electronics & Commun. Engineers of Japan, Sec. E, May 1981 JP "On interleaved codes for error–correcting codes", vol. No. 5, pp. 20–30— Ohkubo et al.

"How to Use ADSL for more than 8 Mbps data?", Orckit Communications Ltd. , Standards Committee TI–Telecommunications, ref. TIE1.4/95–075.

American National Standard for Telecommunications on ADSL (Asymmetric Digital Subscriber Line) published by ANSI in Apr. 1995.

"High Rate (more than 8 Mbps) ADSL Frame Format with Multiple Reed–Solomon Codewords" Reference TIE1.4/95–065 from, Standards Committee T–1 Telecommunications.

Kasami et al., "A Concatenated Coded Modulation Scheme for Error Control", IEEE Transactions on Communications, vol. 38, No. 6, pp. 752–763, Jun. 1990.

(List continued on next page.)

*Primary Examiner*—Stephen M. Baker
*Attorney, Agent, or Firm*—Ware, Fressola, Van Der Sluys & Adolphson LLP

[57] ABSTRACT

A method for interleaving data frames, a forward error correcting device and a modulator including such a device, wherein each data frame to be interleaved is divided into a plurality of words, each containing the same amount of data bytes. An overhead extension is added to the words and additionally, the resulting codewords are applied to an interleave buffer (IB) to be written in matrix-shaped structure of memory cells included in the interleave buffer (IB). This matrix-shaped structure is filled column by column in such a way that each codeword occupies another column. Data bytes are read out of the matrix-shaped structure row by row, as a result of which the data frames are interleaved.

7 Claims, 3 Drawing Sheets

OTHER PUBLICATIONS

Kim et al., "Use of Hidden Markov Chain Models for Evaluating and Selecting Codes for Fading Channels and Erasure Prediction Decoding Co–operated with Interleaver and HMC", 1991 25th Asilomar Conf. on Signals, Systems & Computers, pp. 349–353, Dec. 1991.

Deng, "New Parity Retransmission System Using Product Codes", IEE Proceedings–I, vol. 140, No. 5, pp. 351–356, Oct. 1993.

| 0　　0　/　1　0 | 1　　1　/　8　16 | 2　　2　/　6　23 | 3　　3　/　4　30 |
|---|---|---|---|
| 4　　0　/　2　1 | 5　　1　/　9　17 | 6　　2　/　7　24 | 7　　3　/　5　31 |
| 8　　0　/　3　2 | 9　　1　/　1　9 | 10　　2　/　8　25 | 11　　3　/　6　32 |
| 12　　0　/　4　3 | 13　　1　/　2　10 | 14　　2　/　9　26 | 15　　3　/　7　33 |
| 16　　0　/　5　4 | 17　　1　/　3　11 | 18　　2　/　1　18 | 19　　3　/　8　34 |
| 20　　0　/　6　5 | 21　　1　/　4　12 | 22　　2　/　2　19 | 23　　3　/　9　35 |
| 24　　0　/　7　6 | 25　　1　/　5　13 | 26　　2　/　3　20 | 27　　3　/　1　27 |
| 28　　0　/　8　7 | 29　　1　/　6　14 | 30　　2　/　4　21 | 31　　3　/　2　28 |
| 32　　0　/　9　8 | 33　　1　/　7　15 | 34　　2　/　5　22 | 35　　3　/　3　29 |

Fig. 3

METHOD FOR INTERLEAVING DATA FRAMES, FORWARD ERROR CORRECTING DEVICE AND MODULATOR INCLUDING SUCH A DEVICE

TECHNICAL FIELD

The present invention relates to a method for interleaving data frames which are transmitted from a transmitter to a receiver via a transmission line. It is also directed to a forward error correcting device which performs this method. It is still further directed to a modulator including such a forward error correcting device where the modulator is for modulation of data bytes applied to inputs thereof on a set carriers for transmission thereof over a transmission line coupled to an output thereof.

BACKGROUND OF THE INVENTION

Such a method and equipment to perform such a method are already known in the art, e.g. from the contribution to assist the Standards Committee T1-Telecommunications with reference T1E1.4/95-075. This contribution is entitled 'How to use ADSL for more than 8 Mbps data?', and is filed by Orckit Communications Ltd. Therein, a method for interleaving data frames, called interleave data frames, is proposed which enables ADSL (Asymmetric Digital Subscriber Line) transmission at bit rates higher than 8,16 Mbps. The proposed method is based on the insight that the specification in the draft American National Standard for Telecommunications on ADSL (Asymmetric Digital Subscriber Line) published by ANSI (American National Standards Institute) in April 1995, limiting the interleave frame size to the length of one codeword limits the transmission rate to a maximum of 8,16 Mbps. This transmission rate limitation is avoided by optionally including more than one codeword in one interleave data frame. In the known method, as described in the last paragraph on page 2 of the above mentioned contribution, an interleave data frame contains two words, and in a first step is split into these two words which may have different lengths. Each of the words in a further step is extended with an overhead extension, called FEC redundancy in the already cited contribution. The overhead extensions added to words with different lengths can also have different lengths. The so obtained codewords, called Reed-Solomon codewords in the above cited contribution, are then joined to constitute an extended interleave data frame which is written in an interleave buffer whose memory cells are fixed in a matrix-shaped structure in such a way that each extended interleave data frame occupies one column in the matrix-shaped structure. Since successive Reed-Solomon codewords in the known method can have different lengths, the required flexibility for the overhead adding means in a forward error correction device which is enabled to perform the known method, renders this overhead adding means more complex. Furthermore, in the known solution, the number of columns of the matrix-shaped structure in the interleave buffer remains unchanged when compared to interleaving techniques which are in accordance with the specifications in the above cited draft ADSL Standard and wherein each interleave data frame contains thus only one codeword. As a result, the interleave depth and correction capability for burst errors remains unaffected.

SUMMARY OF THE INVENTION

An object of the present invention is to provide a method and equipment for interleaving data frames in such a way that high bit rates, i.e. bit rates higher than 8,16 Mbps for ADSL applications, are achieved without significant complexity increase of the interleaving means but with optimized interleave depth, i.e. with optimized correction capability for burst errors.

According to the invention, this object is achieved by a method for interleaving data bytes comprised in data frames which are transmitted from a transmitter to a receiver via a transmission line, said method including the steps of a) dividing each data frame of said data frames, into a plurality of codewords; b) adding to each codeword, an extension of overhead bytes thereby transforming said codewords into extended codewords; c) writing in a predefined way said extended codewords into an interleave buffer including memory cells fixed in a matrix-shaped structure with a predetermined number of columns and a predetermined number of rows; and d) reading in a predefined way data bytes out of said interleave buffer, characterized in that said codewords are equal in length and are written in said interleave buffer in such a way that each said codeword occupies one said column in said matrix-shaped structure.

It is also achieved by a forward error correcting device adapted to interleave data bytes comprised in data frames which are transmitted from a transmitter whereof said forward error correcting device forms part, to a receiver via a transmission line, said forward error correcting device comprising: division means to divide each data frame of said data frames, into a plurality of codewords; overhead addition means to add to each codeword of said codewords, an extension of overhead bytes and to thereby transform said codewords into extended codewords; an interleave buffer including memory cells fixed in a matrix-shaped structure with a predetermined number of columns and a predetermined number of rows; a write/read addressing means to control said interleave buffer to enable writing said extended codewords therein in a predefined way, and to enable reading data bytes out of said interleave buffer (IB) in a predefined way, characterized in that said division means is adapted to divide said data frames into codewords of equal length, that said predetermined number of rows of said matrix-shaped structure equals said length of said codewords, and that said write/read addressing means is adapted to control said interleave buffer in such a way that each said codeword occupies one said column in said matrix-shaped structure.

It is still further achieved by a modulator for modulation of data bytes applied to inputs thereof on a set of carriers for transmission thereof over a transmission line coupled to an output thereof, said modulator including a multiplexer, a forward error correcting device, a mapping unit, a transformation unit, a parallel to serial converter and a digital to analog converter, said multiplexer provided to multiplex said data bytes and to thereby generate data frames of a first type of data frames supplied to a first input of said mapping unit via a first output of said multiplexer after addition of an overhead extension in an overhead adding means, and data frames of a second type of data frames applied to an input of said forward error correcting device via a second output of said multiplexer, said forward error correcting device adapted to interleave data bytes comprised in said data frames of said second type of data frames and to apply interleaved data bytes via its output to a second input of said mapping unit, said mapping unit being provided to allocate said data elements to said set of carriers and to thereby generate a frequency domain parallel sequence of data, said transformation unit being included to transform said frequency domain parallel sequence of data applied to its input and to thereby generate a time domain parallel sequence of data, said parallel to serial converter being adapted to convert said time domain parallel sequence of data into a serial sequence of data which is applied to said digital to analog converter included to transform said serial sequence of data into an analog signal and to supply said analog signal to said output of said modulator, said forward error correcting device comprising a division means to divide each data frame of said data frames, into a plurality of codewords; overhead addition means to add to each codeword of said codewords, an extension of overhead bytes and to thereby transform said codewords into extended codewords; an interleave buffer including memory cells fixed in a matrix-shaped structure with a predetermined number of columns and a predetermined number of rows; a write/read addressing means to control said interleave buffer to enable writing said extended codewords therein in a predefined way, and to enable reading data bytes out of said interleave buffer (IB) in a predefined way, characterized in that said division means is adapted to divide said data frames into codewords of equal length, that said predetermined number of rows of said matrix-shaped structure equals said length of said codewords, and that said write/read addressing means is adapted to control said interleave buffer in such a way that each said codeword occupies one said column in said matrix-shaped structure.

In the present method, words and overhead extensions are not allowed to have different lengths. Consequently, the complexity of the overhead adding means included in a forward error correction device which is further equipped with an interleaving device according to the present invention, is not increased when compared to the situation wherein only one codeword constitutes a data frame. Furthermore, since each codeword occupies another column in the matrix-shaped structure of the interleave buffer, the total number of columns compared to the known solution, is multiplied by a factor equal to the number of codewords which constitute one data frame. Evidently, since the matrix-shaped structure is filled column by column in step c and read out row by row in step d, the interleave depth, i.e. the maximum length of a burst error which disturbs less than two data bytes belonging to one codeword, is multiplied by the same factor when compared to the known method described in the contribution of Orckit Communications Ltd.

It is noticed that compared to the known method for interleaving described in the above mentioned Orckit contribution, an increase of the interleave depth of the same amount as in the present invention is obtained in another method for interleaving data frames, proposed by AMATI in its contribution to assist the Standards Committee T1-Telecommunications with reference T1E1.4/95-065, entitled 'High Rate (more than 8 Mbps) ADSL Frame Format with Multiple Reed-Solomon Codewords'. Therein, each data frame, also called interleave frame, is again allowed to contain multiple codewords. However, these codewords are generated from an interleave frame in a first step of the method by separating bytes with odd and even indexes in this interleave frame. Consequently, to be able to perform this first step, a forward error correction device which performs the method proposed by AMATI has to be provided with means which separate bytes with odd and even indexes. Moreover, additional memory means have to be included in the forward error correction device to temporarily store therein the word of odd data bytes whilst the overhead adding means is extending the word of even data bytes, or to temporarily store therein the word of even data bytes whilst the overhead adding means is extending the word of odd data bytes. If such an additional memory means is not provided, both words have to be processed simultaneously by two parallel coupled overhead adding means. The codewords are again called Reed-Solomon codewords in the AMATI contribution. Compared to the present invention, wherein words are built up from successive data bytes in a data frame and wherein successive words are thus extended successively by one overhead adding means without the necessity to temporarily store any word, the method proposed by AMATI in their contribution T1E1.4/95-065 requires the use of a more complex forward error correction device.

In a particular implementation of the present method, as described in claim 2, the data bytes at the transmitter are written into the matrix column by column and are read out of this matrix row by row. It should be noted however that the present method is not restricted to a specific way of writing data bytes into the matrix or reading data bytes out of the matrix since it is clear to a person skilled in the art how to modify the later described embodiment of the present invention to obtain implementations with different write/read schemes for the matrix.

An additional characteristic feature of the present method is that dummy bytes are added to the data frames.

In this way, the length of the incoming data frames is adapted in an artificial way so that it can be divided in words of equal length in step a. Such dummy bytes furthermore may be added to data frames in implementations of the present method wherein the number of columns and number of rows in the matrix-shaped structure have to be coprime, i.e. implementations wherein the number of columns and number of rows may not have a common divisor except one. In particular implementations, as will be seen later on in the description, this requirement has to be fulfilled to enable full occupation of the matrix-shaped structure when writing data bytes therein.

In a particular implementation of the present method, each data frame is divided into two words of equal length in step a. Thus, compared to the known method, described in the above mentioned Orckit contribution, the number of columns in the matrix-shaped structure is doubled as a result of which the interleave depth is doubled too.

A further characteristic of the present method is that in this particular implementation wherein data frames are divided into two words of equal length, one dummy byte is added to the incoming data frames if these frames contain an odd number of data bytes. This dummy byte occupies a predetermined position in the matrix-shaped structure of memory cells in the interleave buffer, e.g. the first cell of the column occupied by the codeword which includes the dummy byte, the last cell of the column occupied by the codeword which includes the dummy byte, . . .

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein:

FIG. 3 is a table illustrating the filling of the matrix-shaped structure in the interleave buffer of the forward error correction device shown in FIG. 2.

BEST MODE FOR CARRYING OUT THE INVENTION

Figure 1:
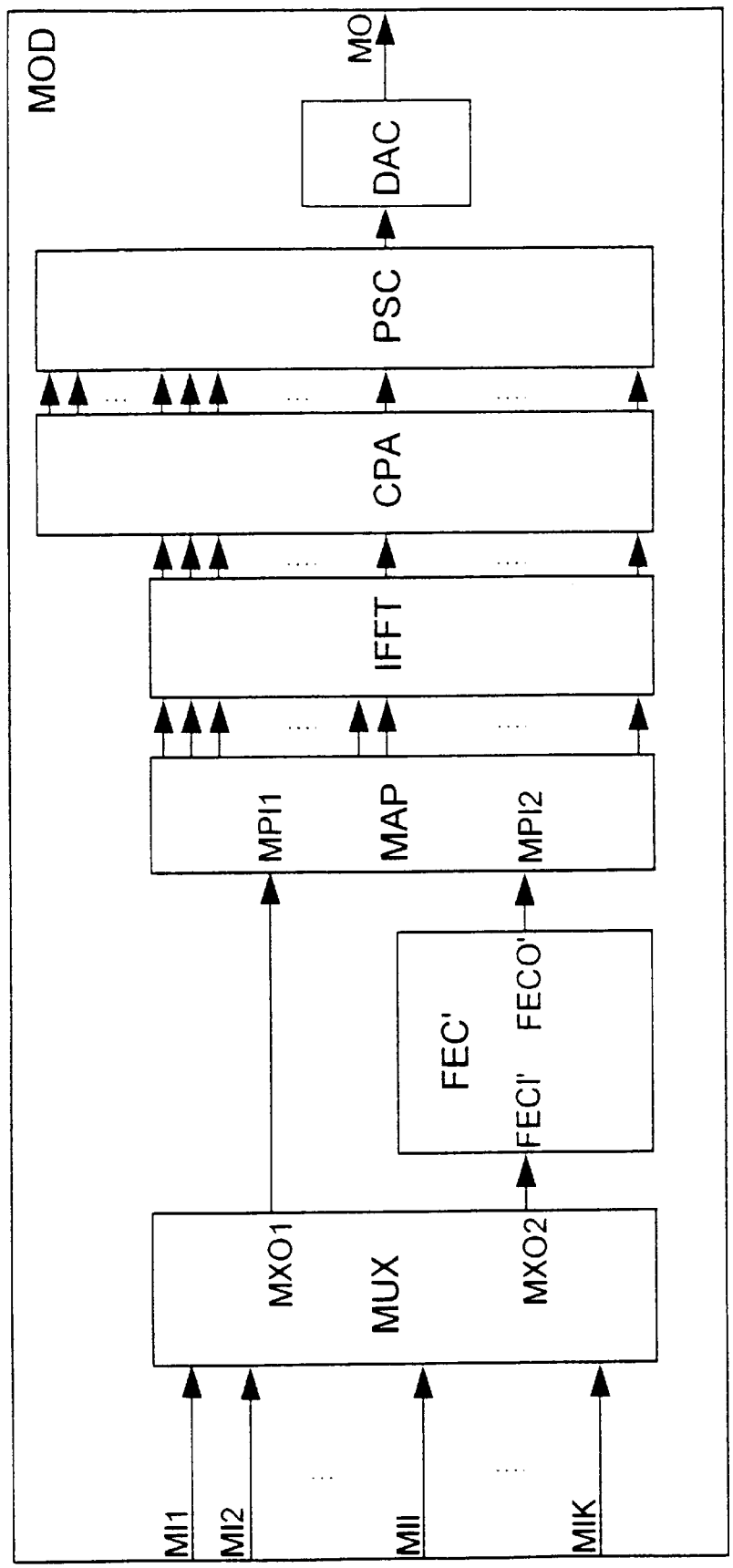
FIG. 1 represents a block diagram of an embodiment of the modulator according to the present invention.

In the following paragraphs, referring to FIG. 1 and FIG. 2, a discrete multitone (DMT) modulator MOD which is a particular embodiment of the modulator according to the present invention will be described. First, all means provided in the DMT modulator MOD of FIG. 1 will be described. Then, the working of the functional blocks represented therein will be explained briefly. The present invention however more specifically relates to the forward error correction device FEC' included in the modulator MOD of FIG. 1. Therefore, a forward error correction device FEC similar to the forward error correction device FEC' of FIG. 1 is drawn more detailed in FIG. 2. Thus, in an additional part of the description wherein is referred to FIG. 2, an embodiment of the forward error correction device FEC according to the present invention will be described and the method performed thereby to interleave data frames will be explained in detail.

The modulator MOD in FIG. 1 includes a multiplexer MUX, a forward error correction device FEC', a mapping unit MAP, an inverse fast fourier transform processing unit IFFT, a cyclic prefix adder CPA, a parallel to serial converter PSC and a digital to analog converter DAC. The modulator MOD further is equipped with K inputs, MI1, MI2, ..., MIK, K being an integer value, and with an output MO.

The multiplexer MUX couples the K inputs, MI1...MIK, to two inputs, MPI1 and MPI2, of the mapping unit MAP via its outputs, MXO1 and MXO2 respectively. Between the first multiplexer output MXO1 and the first mapper input MPI1, an overhead adding device can be coupled. Such an overhead adding means is not shown in FIG. 1. Between the second multiplexer output MXO2 and the second mapper input MPI2, the forward error correction device FEC' is coupled. This forward error correction device FEC' thereto is provided with an input FECI' and an output FECO'. The mapping unit MAP has a set of parallel outputs all of which are coupled to the modulator output MO via the cascade connection of the inverse fast fourier transform processing unit IFFT, the cyclic prefix adder CPA, the parallel to serial converter PSC and the digital to analog converter DAC.

Each of the modulator inputs, MI1...MIK, corresponds to a channel via which data bytes are applied to the modulator MOD. Data bytes which are delay sensitive are multiplexed into fast data frames by the multiplexer MUX and additionally are applied to the first input MPI1 of the mapping unit, possibly after addition of an overhead extension in the above mentioned overhead adding means. Delay tolerant data bytes on the other hand are multiplexed into interleave data frames by the multiplexer MUX and, before being applied to the second input MPI2 of the mapping unit MAP, are interleaved in the forward error correction device FEC'. In the mapping unit MAP, fast and interleaved data bytes are then allocated to a set of carriers to be modulated thereon. The allocation or division of the data bytes over the carriers is executed on the basis of a specific algorithm executed thereto by the mapping unit MAP. The modulated carriers obtained in this way are represented by 256 complex numbers if it is assumed that 256 carriers constitute the set of carriers. These numbers appear at the parallel outputs of the mapping unit MAP and constitute a frequency domain sequence. This frequency domain sequence is transformed into a time domain sequence by the inverse fast fourier transform processing unit IFFT. If the transmission line, coupled to the modulator MOD but not shown in FIG. 1 would not be plagued by intersymbol interference, the time domain sequence could immediately be converted into a serial sequence of digital data and additionally into an analog signal via the cascade connection of the parallel to serial converter PSC and the digital to analog converter DAC. However, since the transmission line has no ideal impulse response, intersymbol interference will always occur. To compensate for this intersymbol interference, a cyclic prefix is added to the time domain sequence in the cyclic prefix adder CPA. Some of the data at the end of the time domain sequence are prepended to this time domain sequence to thereby constitute an extended time domain sequence whose prefix is equal to its final part. The extended time domain sequence is converted into a serial time domain sequence and transformed into an analog signal before it is applied to the transmission line via the modulator output MO.

The block scheme of the Discrete Multi Tone modulator MOD in FIG. 1 will not be described in further detail since such a detailed description is of no importance for the present invention. Further details with respect to ADSL (Asymmetric Digital Subscriber Line) requirements are described in the already mentioned draft ANSI Standard on ADSL whilst specific implementations of Discrete Multi Tone modulators are found in the articles 'A multicarrier E1-HDSL Transceiver System with Coded Modulation', written by Peter S. Chow, Naofal Al-Dhahir, John M. Cioffi and John A. C. Bingham and published in the issue Nr. 3, May/June 1993 of the Journal of European Transactions on Telecommunications and Related Technologies (ETT), pages 257–266, and 'Performance Evaluation of a Multichannel Transceiver System for ADSL and VHDSL Services' from Peter S. Chow et al., published in the issue Nr. 6, August 1991 of the Journal of European Transactions on Telecommunications and Related Technologies (ETT), pages 909–919.

The present invention more specifically relates to the forward error correction device FEC' and the method performed thereby to interleave data frames which have to be transmitted at bit rates higher than 8·16 Mbps. Indeed, taking into account the limitation specified in the above mentioned draft ANSI Standard on ADSL, that there is maximum one codeword per interleave data frame and knowing that the number of data bytes per codeword has to be limited to 255, it can be proven easily that the bit rate can not obtain values higher than 8·16 Mbps. Since the number of bytes transmitted per discrete multi tone (DMT) symbol is equal to the number of bytes in one interleave data frame (after extension thereof) and since such a discrete multi tone (DMT) symbol is defined as a symbol with a duration of 250 $\mu s$, the maximum bit rate is expressed as follows:

$$R\max = \frac{255 \frac{\text{bytes}}{\text{frame}} \cdot 1 \frac{\text{frame}}{DMT-\text{symbol}} \cdot 8 \frac{\text{bits}}{\text{byte}}}{250 \frac{\mu\text{sec}}{DMT-\text{symbol}}}$$

and thus:

$R\max = 8\cdot16\cdot10^6$ bits/sec=8,16 Mbps

Figure 2:
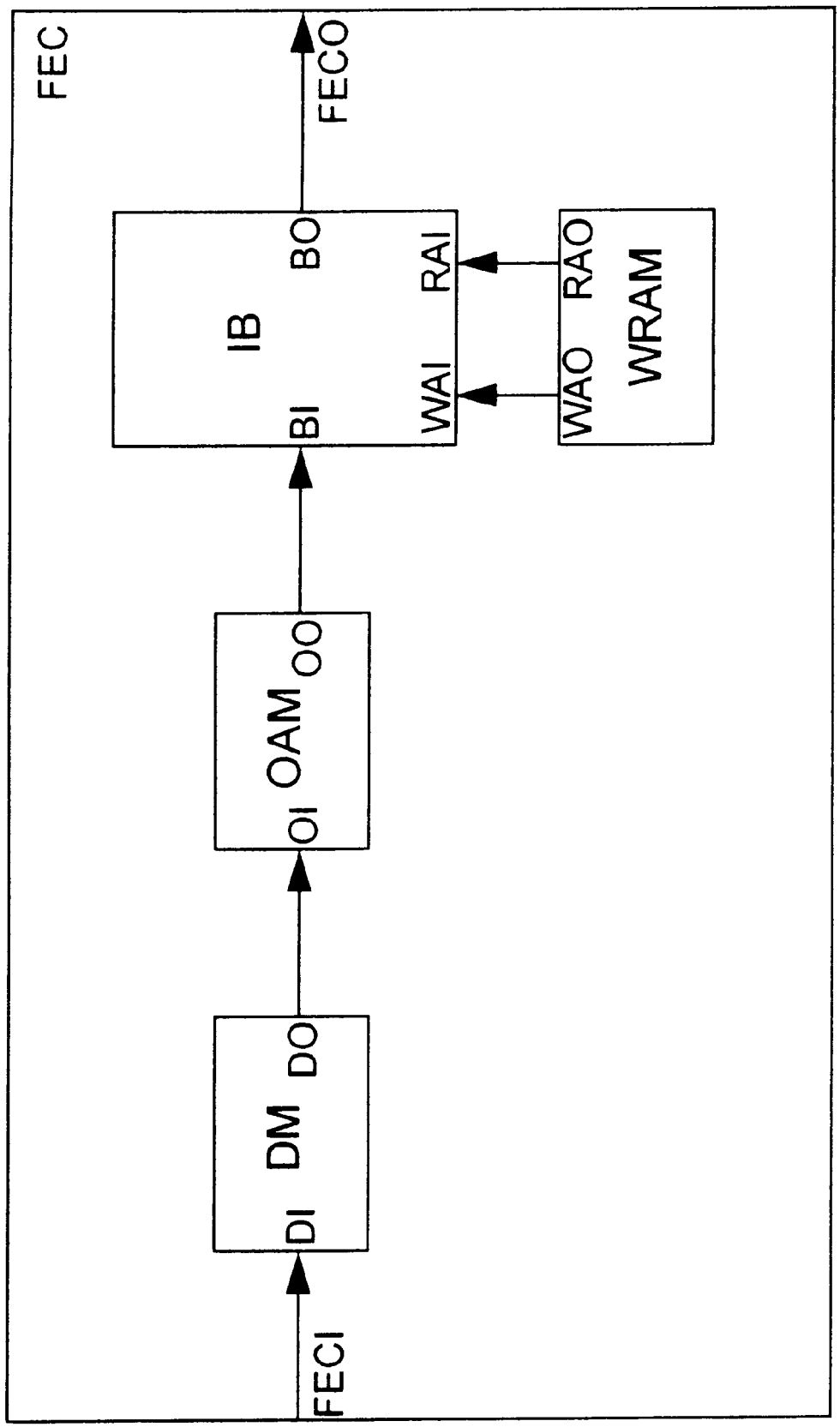
FIG. 2 represents a block scheme of an embodiment of the forward error correction device according to the present invention.

To enable transmission at data rates up to 16·32 Mbps, the forward error correction device FEC of FIG. 2 uses two codewords per data frame.

To perform the interleaving, the forward error correction device FEC includes a division means DM, an overhead adding means OAM, an interleave buffer IB and a write/read addressing means WRAM.

An input DI of the division means DM is coupled to an input FECI of the forward error correction device FEC, whilst an output DO of this division means DM is connected to an input OI of the overhead adding means OAM. An output OO of this overhead adding means OAM is connected to an interleave buffer input BI and an output BO of the interleave buffer IB is coupled to an output FECO of the forward error correction device FEC. The write/read addressing means WRAM is provided with a write addressing output WAO and a read addressing output RAO connected to a write addressing input WAI and a read addressing input RAI of the interleave buffer IB respectively. In the interleave buffer IB but not shown in FIG. 2, memory cells are fixed in a matrix-shaped structure having a predetermined number of columns and a predetermined number of rows, this number of rows being equal to the number of data bytes in one codeword. The number of columns equals twice the number of frames that have to be interleaved simultaneously and, as will be seen, determines the interleave depth, i.e. the maximum length of a burst error that doesn't corrupt more than one data byte belonging to the same codeword.

To explain the different steps in the present method, data frames applied to the input FECI of the forward error correction device FEC are in a first example supposed to include 14 data bytes. Each data frame enters the division means DM via the input DI thereof and is divided therein into two words of equal length. These words comprise thus 7 data bytes in this first example and are applied successively to the overhead adding means OAM which adds an overhead extension of 2 data bytes to each word. The so obtained codewords contain 9 data bytes. As a result, the number of rows in the matrix-shaped structure in the interleave buffer IB equals 9. If an interleave depth of 4 codewords has to be guaranteed, or in other words, if two data frames have to be interleaved simultaneously, the number of columns in the matrix-shaped structure has to be 4. The matrix-shaped structure built up in this way is shown in FIG. 3. This matrix-shaped structure is written vertically and read horizontally. Two data frames are interleaved. Thereto, codewords are written in the matrix-shaped structure in such a way that each codeword occupies one column. The columns are numbered from left to right starting from 0. Similarly, the rows in the matrix-shaped structure are numbered from top to bottom starting with 0. Codeword i, i being an integer number from 0 to 3, is written in column i.R mod C, wherein R represents the number of rows, which is equal to 9, and wherein C represents the number of columns which is equal to 4. The first byte of codeword i is written in row $$\left\lfloor \frac{i \cdot R}{C} \right\rfloor,$$

wherein $\lfloor \rfloor$ denotes the largest integer smaller than or equal to'. The remaining bytes of a codeword are written sequentially vertically within the same column as the first byte of this codeword. FIG. 3 gives an overview of the codewords and bytes which are written in the memory cells. Therein, a thick border is drawn around the table cells corresponding to the first bytes of codewords. The first number written in the centre of each cell denotes the index i of the codeword where the byte forms part of. The second number in the centre of each cell denotes the index number of each data byte within its codeword. These bytes are numbered from 1 to 9 in the codewords at the output of the overhead adding means OAM. The number in the lower left corner of each box gives the order in which bytes are written in the matrix. The number in the upper right corner of each box gives the order in which bytes are read out of the matrix-shaped structure. At the transmitter, writing occurs before reading. The delay between writing and reading of data bytes can be expressed in bytes. Indeed, when a byte is the second byte to be written in the matrix and the eighth byte to be read out of the matrix, this byte experiences a delay of 6 bytes. The delay is thus calculated by subtracting in FIG. 3 from the number in the upper right corner of a table cell, the number in the lower left corner of the table cell, this difference being increased by C.R if its value is negative. The k'th byte of a codeword, where k represents the byte index number between 1 and 9, incurs (k−1).(C−1) bytes of delay or (k−1).3 bytes of delay. The total delay is a combination of the delay at the transmitter's side and the delay at the receiver's side. Indeed, a similar matrix-shaped structure is included in a deinterleave buffer at the receiver's side to perform there the deinterleaving. Consequently, in the receiver, bytes of DMT (discrete multi tone) symbols are written horizontally and read vertically. At the receiver, reading occurs before writing. As a result, the k'th byte in a codeword at the receiver's side experiences a delay of C.R−(k−1).(C−1) or 36−(k−1).3 bytes. Considering the delays at the transmitter's and the receiver's side, it is seen that each byte is delayed over C.R or 36 bytes, which is equal to the number of memory cells included in the matrix-shaped structure.

In the transmitted sequence, i.e. the sequence of data bytes read out of the matrix-shaped structure at the transmitter's side, two bytes belonging to the same codeword are always at a distance of C bytes (C=4 in the described example) apart from each other. Thus, a burst error of length C can never hit two bytes which belong to the same codeword. Compared to solutions wherein codewords belonging to one data frame are written in one column, the error correcting capability in the presence of burst errors of the error correction code applied to the codewords is multiplied by a factor equal to the number of codewords per data frame. The latter statement is untrue if the words belonging to one data frame are preinterleaved as described in the already mentioned AMATI contribution. However, preinterleaving of codewords requires additional means in the forward error correction device and thus, as already said, renders the forward error correction device more complex.

Consider now a second example wherein data frames applied to the input FECI of the forward error correction device FEC are constituted of 13 data bytes. Such a data frame can not be divided into two words of equal length. Therefore, such data frames containing an odd number of data bytes are lengthened by adding thereto a dummy byte. This dummy byte is an artificial byte which occupies one memory cell in the matrix-shaped structure but which is not transmitted. The presence of such a dummy byte and the position thereof in the matrix-shaped structure should however be known by the receiver. By transmitting in an initial conversation between transmitter and receiver, an indication of the number of data bytes per data frame before the dummy byte is added thereto, the receiver is aware of the presence of such a dummy byte. When this dummy byte, according to a predetermined rule, is given a predetermined position in the matrix-shaped structure, e.g. the first position of the second codeword, the last position of the second codeword, . . . , the receiver has to use the same predetermined rule to assign the dummy byte to the same position in the matrix-shaped structure at the receiver's side. Thus, transmitter and receiver should position dummy bytes according to the same rule.

Such dummy bytes are also added to the codewords if the length of these codewords, i.e. the number of rows in the matrix-shaped structure, and the number of columns in the matrix-shaped structure are not coprime. Indeed, if C and R have a common divisor different from 1, which is an equivalent expression for saying that C and R are not coprime, the above explained interleaving scheme will not fill the complete matrix-shaped structure but only some columns thereof. Indeed, when writing codeword i in the column with index i.R mod C, some columns of the matrix-shaped structure will be occupied by more than one codeword while other columns thereof are left unoccupied if C and R are not coprime. Therefore, in such an embodiment of the present invention, dummy bytes are added to the data frames until these data frames can be divided in words whose length is coprime to C. It is noticed that dummy bytes rendering the number of columns and number of rows in the matrix coprime or making the data frame length even, may be added before or after the overhead adding means OAM in FIG. 2. When added before the overhead adding means OAM however, the values of the dummy bytes have to be known by the receiver.

Since dummy bytes are not transmitted, they do not change the total delay. The delay thus remains proportional to the surface of the matrix-shaped structure which is occupied by bytes different from dummy bytes. However, a burst of length C may hit two bytes of the same codeword due to the presence of dummy bytes. The effective interleave depth and corresponding error correction capability in the presence of burst errors are thus reduced in rows of the matrix that contain dummy bytes. For this reason, dummy bytes are spread out over the entire matrix in an adequate implementation of the present method. In less adequate implementations of the present method, the dummy bytes belonging to one codeword are concentrated at the beginning or end of this codeword. In such implementations, a slight decrease of correctable burst length is an inevitable disadvantage. It should be noted that the addition of dummy bytes is also described in the mentioned draft Standard on ADSL. Therefore, the addition of dummy bytes in the present invention is an extension of the technique described in this draft Standard.

It has to be noted that although the described embodiment of the modulator is used in ADSL applications, the present method can be implemented in other transmission systems too, e.g. coax cable applications such as DMT (Discrete Multi Tone) for coax, radio transmission applications such as DVB (Digital Video Broadcast), DAB (Digital Audio Broadcast) and mobile communication.

It is also remarked that although the described modulator includes an inverse fast fourier transform processing unit and cyclic prefix adder to convert the frequency domain sequence of data into a time domain sequence of data, it is obvious that the present method can be implemented in a modulator provided with other transformation units, e.g. a DCT (Discrete Cosine Transform) processing unit as is included in a DWMT (Discrete Wavelet Multi Tone) modulator.

Furthermore, it is noticed that the present invention is not limited to the frame length, codeword length, or size of the matrix-shaped structure in the described embodiments and examples, but various variations and modifications may be made by persons skilled in the art without departing from the scope of the present invention.

While the principles of the invention have been described above in connection with specific apparatus, it is to be clearly understood that this description is made only by way of example and not as a limitation on the scope of the invention.

What is claimed is:

1. A method for interleaving data bytes comprised in data frames which are transmitted from a transmitter to a receiver via a transmission line, said method including the steps of:
   a. dividing each data frame of said data frames, into a plurality of words;
   b. adding to each word, an extension of overhead bytes thereby transforming said words into codewords;
   c. writing in a predefined way said codewords into an interleave buffer including memory cells fixed in a matrix-shaped structure with a predetermined number of columns and a predetermined number of rows; and
   d. reading in a predefined way data bytes out of said interleave buffer; characterized in that said codewords are equal in length and are written in said interleave buffer in such a way that each said codeword occupies one said column in said matrix-shaped structure.

2. A method according to claim 1, characterized in that in said step c, said codewords are written into said interleave buffer column by column, and that in said step d, said data bytes are read out of said interleave buffer row by row.

3. A method according to claim 1, characterized in that to each said data frame, a number of dummy data bytes are added, said number being chosen to enable dividing said data frame into words of an equal predetermined length, i.e. which comprise an equal predetermined number of said data bytes.

4. A method according to claim 1, characterized in that in said step a, each said data frame is divided into two said words as a result of which said predetermined number of columns of said matrix-shaped structure equals twice the number of said data frames that is interleaved simultaneously in said interleave buffer.

5. A method according to claim 4, characterized in that when a said data frame comprises an odd number of said data bytes, a dummy byte is added to said data frame to enable dividing said data frame into two said words of equal length, said dummy byte in said step c being written in a predetermined one of said memory cells.

6. A forward error correcting device (FEC) adapted to interleave data bytes comprised in data frames which are transmitted from a transmitter whereof said forward error correcting device (FEC) forms part, to a receiver via a transmission line, said forward error correcting device (FEC) comprising:
   a. division means (DM) to divide each data frame of said data frames into a plurality of words;
   b. overhead addition means (OAM) to add to each word of said words, an extension of overhead bytes and to thereby transform said words into codewords;
   c. an interleave buffer (IB) including memory cells fixed in a matrix-shaped structure with a predetermined number of columns and a predetermined number of rows; and
   d. a write/read addressing means (WRAM) to control said interleave buffer (IB) to enable writing said codewords therein in a predefined way, and to enable reading data bytes out of said interleave buffer (IB) in a predefined way;
   characterized in that said division means (DM) is adapted to divide said data frames into words of equal length, that said predetermined number of rows of said matrix-shaped structure equals said length of said codewords, and that said write/read addressing means (WRAM) is adapted to control said interleave buffer (IB) in such a way that each said codeword occupies one said column in said matrix-shaped structure.

7. A modulator (MOD) for modulation of data bytes applied to inputs (MI1, MI2, . . . MII, . . . , MIK) thereof on a set of carriers for transmission thereof over a transmission line coupled to an output (MO) thereof, said modulator (MOD) including a multiplexer (MUX), a forward error correcting device (FEC', FEC), a mapping unit (MAP), a transformation unit (IFFT, CPA), a parallel to serial converter (PSC) and a digital to analog converter (DAC), said multiplexer (MUX) provided to multiplex said data bytes and to thereby generate data frames of a first type of data frames supplied to a first input (MPI1) of said mapping unit (MAP) via a first output (MXO1) of said multiplexer (MUX) after addition of an overhead extension in an overhead adding means, and data frames of a second type of data frames applied to an input (FECI', FECI) of said forward error correcting device (FEC', FEC) via a second output (MXO2) of said multiplexer (MUX), said forward error correcting device (FEC', FEC) adapted to interleave data bytes comprised in said data frames of said second type of data frames and to apply interleaved data bytes via its output (FECO') to a second input (MPI2) of said mapping unit (MAP), said mapping unit (MAP) being provided to allocate said data elements to said set of carriers and to thereby generate a frequency domain parallel sequence of data, said transformation unit (IFFT, CPA) being included to transform said frequency domain parallel sequence of data applied to its input and to thereby generate a time domain parallel sequence of data, said parallel to serial converter (PSC) being adapted to convert said time domain parallel sequence of data into a serial sequence of data which is applied to said digital to analog converter (DAC) included to transform said serial sequence of data into an analog signal and to supply said analog signal to said output (MO) of said modulator (MOD), said forward error correcting device (FEC', FEC) comprising:

a. division means (DM) to divide each data frame of said data frames, into a plurality of words;

b. overhead addition means (OAM) to add to each word of said plurality of words, an extension of overhead bytes and to thereby transform said words into codewords;

c. an interleave buffer (IB) including memory cells fixed in a matrix-shaped structure with a predetermined number of columns and a predetermined number of rows; and d. a write/read addressing means (WRAM) to control said interleave buffer (IB) to enable writing said codewords therein in a predefined way, and to enable reading data bytes out of said interleave buffer (IB) in a predefined way;

characterized in that said division means (DM) is adapted to divide said data frames into words of equal length, that said predetermined number of rows of said matrix-shaped structure equals said length of said codewords, and that said write/read addressing means (WRAM) is adapted to control said interleave buffer (IB) in such a way that each said codeword occupies one said column in said matrix-shaped structure.

\* \* \* \* \*